US009281811B2

(12) United States Patent
Bruennert et al.

(10) Patent No.: US 9,281,811 B2
(45) Date of Patent: Mar. 8, 2016

(54) CIRCUIT, A METHOD AND A SYNTHESIZER FOR GENERATING A SYNTHESIZED SIGNAL WITH A SELECTABLE FREQUENCY

(71) Applicant: Intel IP Corporation, Santa Clara, CA (US)

(72) Inventors: Michael Bruennert, Unterhaching (DE); Andreas Menkhoff, Oberhaching (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/546,127

(22) Filed: Nov. 18, 2014

(65) Prior Publication Data

US 2015/0171848 A1 Jun. 18, 2015

(30) Foreign Application Priority Data

Dec. 18, 2013 (DE) .......................... 10 2013 114 367

(51) Int. Cl.
*H03K 5/14* (2014.01)
(52) U.S. Cl.
CPC ........................................ *H03K 5/14* (2013.01)
(58) Field of Classification Search
CPC .. H03L 7/16; H03L 7/18; H03K 2005/00293; H03K 2005/00058; H03K 5/04; H03K 5/05; H03K 5/06; H03K 5/13; H03K 5/131; H03K 5/135; H03K 5/153; H03K 5/1534; G06F 1/04; G06F 1/08
USPC ......... 327/113, 115, 117, 261, 263–264, 276, 327/278, 291, 299
See application file for complete search history.

(56) References Cited

U.S. PATENT DOCUMENTS

| | | | |
|---|---|---|---|
| 8,736,317 B2 * | 5/2014 | Yeo | H03K 23/52 327/115 |
| 2004/0196108 A1 | 10/2004 | Craninckx | |
| 2011/0095830 A1 | 4/2011 | Tsangaropoulos et al. | |
| 2015/0171848 A1 * | 6/2015 | Bruennert | H03K 5/14 327/276 |

* cited by examiner

*Primary Examiner* — An Luu
(74) *Attorney, Agent, or Firm* — Eschweiler & Associates, LLC

(57) ABSTRACT

A circuit for generating a oscillating with a selectable frequency, comprises a delay generator configured to identify a first time instant, the first time instant being delayed with respect to a signal edge of a clock signal oscillating with a predetermined clock frequency. A delay element is configured to provide a signal edge, the signal edge being delayed with respect to the first time instant such that the signal edge is provided at a second time instant corresponding to a signal edge of the synthesized signal.

21 Claims, 6 Drawing Sheets

CIRCUIT, A METHOD AND A SYNTHESIZER FOR GENERATING A SYNTHESIZED SIGNAL WITH A SELECTABLE FREQUENCY

CROSS REFERENCE TO RELATED APPLICATIONS

This application claims priority to German Patent Application No. 10 2013 114 367.9, filed Dec. 18, 2013 and is hereby incorporated by reference in its entirety.

FIELD

Examples relate to circuits, methods and synthesizers for generating a synthesized signal with a selectable frequency.

BACKGROUND

Multiple applications require the generation of a signal with a variable oscillation frequency. For example, mobile telecommunication applications may require the use of digitally-controlled oscillators (DCO) or voltage-controlled oscillators (VCO) to support multiple frequency bands. A use case for a digitally-controllable, accurate synthesizer with a quickly varying output frequency may, for example, be the application within power efficient polar modulators for high bandwidth wireless standards, such as for example Long Term Evolution mobile telecommunication networks (LTE). Modulators or frequency synthesizers providing for a fast variation of the output frequency may be based on digitally-controlled oscillators so that their control may be performed in the digital domain. However, conventional approaches with analogue oscillator signals may face severe trade-offs between the static and the dynamic frequency tuning range, the maximum speed of modulation, phase noise, power, area and cross-coupling between multiple parallel paths. Hence, the applicability in advanced communication systems, as for example LTE with carrier aggregation is limited. Therefore, there may be a desire to provide for circuits, synthesizers and methods for synthesizing a signal with a selectable frequency with improved characteristics.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples are shown by way of example in the figures and will herein be described in detail. It should be understood, however, that there is no intent to limit examples to the particular forms disclosed, but on the contrary, further examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
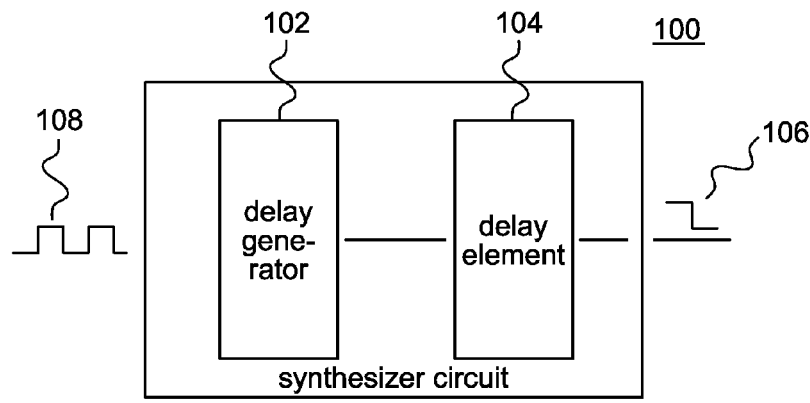
FIG. 1 shows a block diagram of an example of a circuit.

Some examples of a circuit for generating a synthesized signal oscillating with a selectable frequency comprise a delay generator configured to identify a first time instant, the first time instant being delayed with respect to a first signal edge of a clock signal oscillating with a predetermined clock frequency. A delay element is configured to provide a second signal edge, the second signal edge being delayed with respect to the first time instant such that the second signal edge is provided at a second time instant corresponding to a third signal edge of the synthesized signal. The examples may provide for a synthesized signal oscillating with a selectable frequency which has a high dynamic range, a high range of possible output frequencies and the capability of very high frequency variations per unit time. This may be due to the cause that the second signal edge corresponding to a signal edge of the synthesizer signal is derived from a clock signal oscillating with a predetermined clock frequency by means of two subsequent delays. This may, for example, provide for the possibility of combining the generation of a coarse delay having a lower time resolution with the generation of a fine delay having a higher time resolution. While the coarse delay may provide for the possibility of significantly changing the frequency of the generated synthesized signal between two subsequent oscillations or cycle times, the fine delay may, at the same time, provide for a high accuracy of the frequency or the signal edges of the synthesized signal. FIG. 1 schematically illustrates an example of a circuit by means of a block diagram.

The circuit 100 for generating a synthesized signal oscillating with a selectable frequency comprises a delay generator 102 and a delay element 104. The delay generator 102 is configured to identify a first time instant, the first time instant being delayed with respect to a first signal edge of a clock signal 108 oscillating with a predetermined clock frequency. The delay element 104 is configured to provide a second signal edge 106, the signal edge 106 being delayed with respect to the first time instant such that the second signal edge 106 is provided at a second time instant corresponding to a third signal edge of the synthesized signal. The second signal edge 106 may directly be used as a signal edge within the synthesized signal, i.e. the third signal edge may be identical to the second signal edge. The second signal edge may be a falling edge or a rising edge of a digital signal or a falling portion or a rising portion of a continuous waveform of a synthesized analogue signal.

According to some examples, the delay generator 102 is configured to provide for a coarse delay. According to some examples, this is achieved by configuring the delay generator 102 such that it selects a select signal edge of the clock signal 108 at the first time instant with a predetermined time resolution. The time resolution indicates a minimal time between two subsequent selectable edges. For example, a time resolution may correspond to one half of the cycle time of the clock signal 108 such that each of the consecutive rising or falling edges of the clock signal 108 may be selected. According to further examples, however, the time resolution may be lower. For example, it may correspond to a complete cycle time so that subsequent rising edges or subsequent falling edges may be selected. The delay element 104 is configured to provide the second signal edge 106 such that it is delayed with respect to the select signal edge as provided or determined by the delay generator 102. The delay element 104 may be configured to provide for a fine time resolution so that a maximum delay variation of the delay element may correspond to the predetermined time resolution of the delay generator 102. According to such an example, signal edges 106 may be provided at arbitrary time with a time resolution as given by the fine time resolution of the delay element 104.

The delay element 104 may cover a maximum delay variation corresponding to the predetermined time resolution of the delay generator 102. It may so be implemented with high accuracy and comparatively low cost with respect to area and power consumption. According to further examples, the maximum delay variation of the delay element 104 may be bigger than the predetermined time resolution of the delay generator 102. This may, for example, allow to use existing circuitry or delay elements 104 in multiple implementations of circuits 100.

According to further examples, the delay generator 102 is configured to provide for the fine time resolution in that it is configured to provide a delayed clock signal, the delayed clock signal being delayed with respect to the clock signal 108 such that a delayed signal edge of the delayed clock signal occurs at the first time instant after the first signal edge. Accordingly, the delay element 104 is configured to select the second signal edge of the delayed clock signal at the time instant corresponding to the third signal edge of the synthesized signal with a predetermined time resolution, which indicates a minimal time between two subsequent selectable edges. The delay generator 102 may, for example, generate a delayed copy of the clock signal 108 so that the delayed clock signal also oscillates with the predetermined clock frequency of the clock signal 108.

Figure 2:
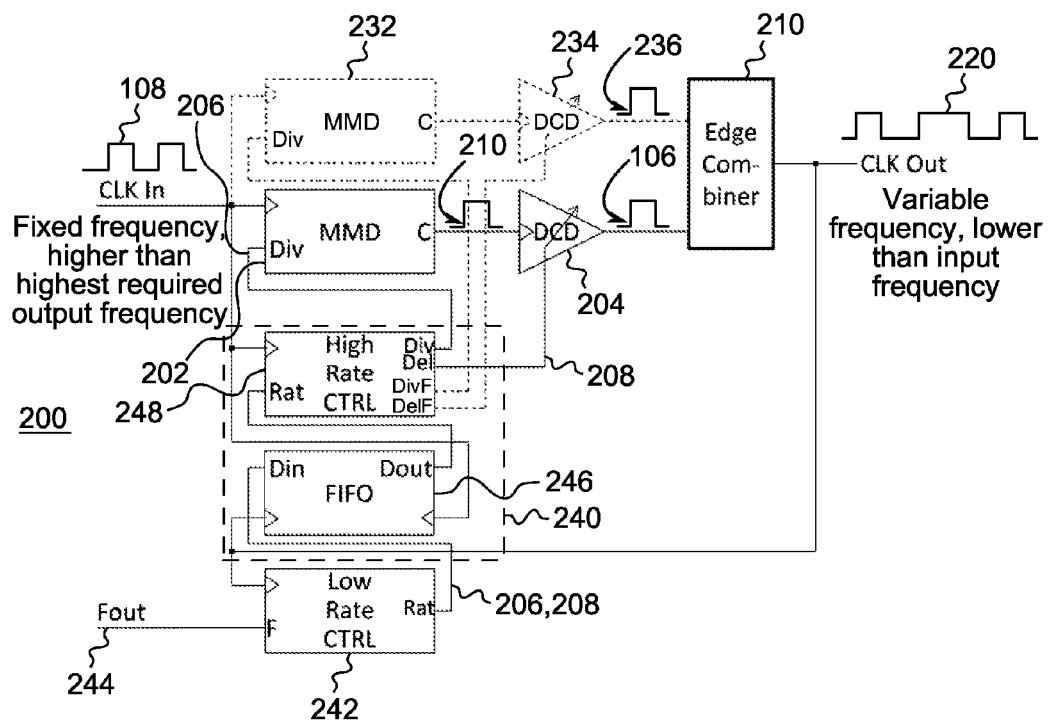
FIG. 2 shows a block diagram of a further example of a circuit.
Figure 5:
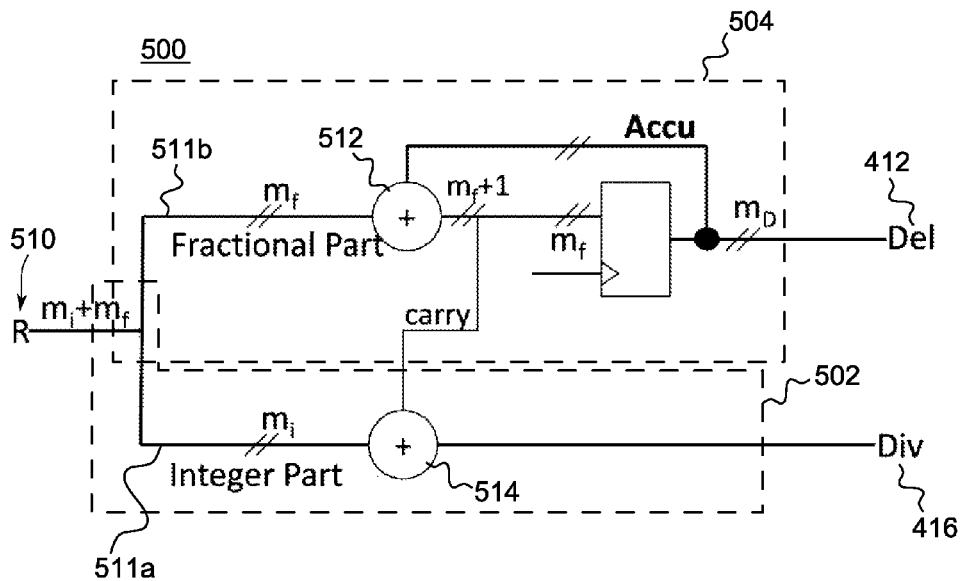
FIG. 5 shows an example of a controller used to control the synthesizer of FIG. 2.
Figure 7:
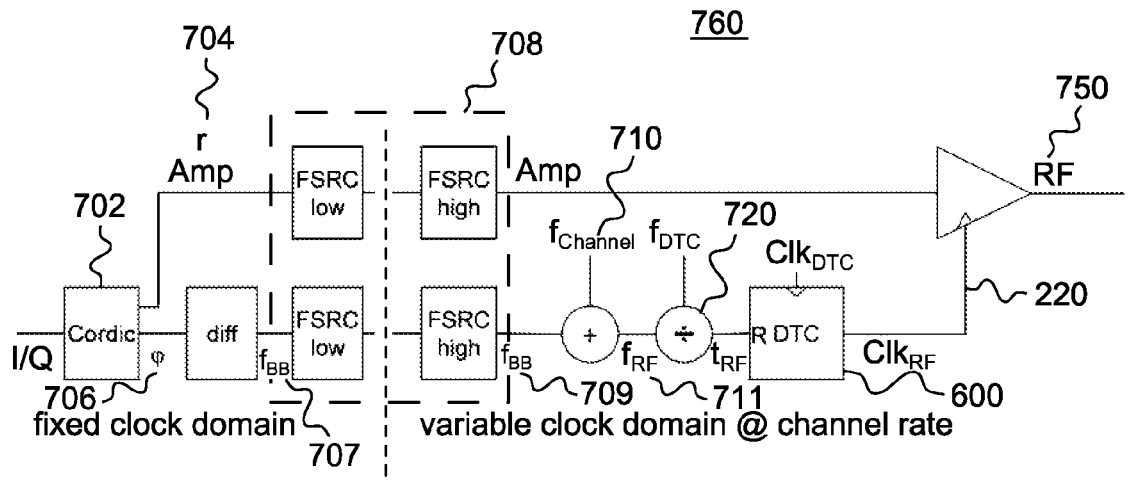
FIG. 7 illustrates an example of a circuit within a polar modulator.

FIG. 2 illustrates a particular example of a circuit 200 in which the delay generator is implemented as a multi-modulus divider 202 and in which the delay element is implemented as a digitally-controlled delay 204. The operation of the delay generator or a multi-modulus divider 202 is controlled by means of a time identification signal 206 and the operation of the delay element or digitally-controlled delay 204 is controlled by a delay control signal 208. The generation of the time identification signal 206 and the delay control signal 208 are detailed in the subsequent description of FIGS. 5 and 7 illustrating examples of controllers for controlling a circuit.

The circuit 200 operates based on a clock signal 108 oscillating with a predetermined clock frequency. Controlled by the time identification signal 206, the multi-modulus divider 202 serves as a delay generator and selects a select signal edge of the clock signal 108 at the first time instant. The first time instant is determined by a division of the frequency of the clock signal 108 by as indicated by the time identification signal 206. The multi-modulus divider 202 generates or selects a select signal edge 210 at the first time instant which serves as an input to the digitally-controlled delay 204 serving as a delay element. The select signal edge is delayed by the digitally-controllable delay 204 so as to provide the second signal edge 106 of the synthesized signal at a second time instant being delayed with respect to the first time instant by an amount indicated by the delay control signal 208. Depending on the particular implementation, the second signal edge 106 may be directly used as a (third) signal edge within the synthesized signal or further elements may be triggered by the second signal edge 106 so as to finally provide for signal edges within the synthesized signal. As one particular example for the latter case, FIG. 2 illustrates an edge combiner 210 which may serve to generate rising and falling edges for subsequent occurrences of second signal edges 106 provided by the delay element 104. Hence, the edge combiner 210 may serve to provide subsequent rising and falling third signal edges so as to provide a synthesized signal 220 having rising as well as falling edges even if it receives only rising edges as a trigger.

FIG. 2 illustrates optional further components of a further example of a circuit in dashed lines. Further examples may comprise a further multi-modulus divider 232 as a further delay generator as well as a further digitally-controlled delay 234 as a further delay element. The further delay generator and the further delay element may be used to provide for signal edges 236 which correspond to falling edges of the synthesized signal 220 while the delay generator and the element may provide for a signal edge 206 corresponding to a rising edge of the synthesized signal. That is, according to some examples, the rising signal edges of the synthesized signal are provided by a first pair of a delay generator and a delay element while the falling signal edges are provided by a second pair of a delay generator and a delay element. This may, for example, allow to increase the time resolution of the circuit and allow for output frequencies of the synthesized signal being as high as or even higher than the frequency of the clock signal 108. In such an example, the edge combiner 210 may, for example, serve to provide a rising edge of the synthesized signal 220 on occurrence of the signal edge 106 while a falling edge of the synthesized signal 220 may be provided on the occurrence of the signal edge 236.

According to the particular implementation of FIG. 2, the determination of the time indication signal 206 and of the delay control signal 208 is performed with the frequency of the synthesized signal 220 and hence, typically with a lower rate than the rate provided by the clock signal 108. This may serve to preserve energy when the associated calculations are performed depending on the lower rate of the synthesized signal 220. To this end, FIG. 2 furthermore illustrates an example of a rate conversion circuit 240 serving to receive the time indication signal 206 and the delay control signal 208 at a rate as determined by the synthesized signal and to output the respective signals at an appropriate time at a rate determined by the clock signal 108 so as to be able to operate the delay generator and the delay element at the rates of the clock signal 108.

Assuming that a controller 242 updates or determines the time indication signal 206 and the delay control signal 208 at a rate corresponding to the selectable frequency 244 of the synthesized signal 220, said signals 206 and 208 are provided to the input of a first input first output buffer 246 (FIFO) at each clock cycle of the synthesized signal 220. To this end, a feedback of the synthesized signal 220 is provided to an input of the controller 242 and the FIFO 246 by means of a feedback link 219. The FIFO 246 is read out at a rate determined by the clock signal 108 so as to provide the time indication signal 206 and the delay control signal 208 to the delay generator and the delay element via a high rate controller 248 at the rate as determined by the clock signal 108 so as to be applicable in the clock domain of the clock signal 108 oscillating with a predetermined clock frequency. One may initialize the FIFO 246 with a start value for each of the time indication signal 206 and the delay control signal 208 at startup to assure the generation of a first clock signal of the synthesized signal which in turn makes the controller 242 provide a first pair of time indication signal 206 and the delay control signal 208 depending on the selectable frequency. Instead, a trigger to the controller 242 may be provided by arbitrary other means.

In other words, an example of a digital to time converted based frequency synthesizer 200 is given in FIG. 2. A high, constant frequency clock 108 enters a multi-modulus divider 202 (MMD), which divides it down by a variable ratio. A digitally controlled delay (DCD) line 204 shifts the edges of the MMD output on a finely quantized grid. The delay range of the DCD 204 may span exactly one (or an integer multiple) period of the fixed frequency input clock 108. MMD 202 and DCD 204 together allow generating edges at arbitrary times on the quantized grid provided by the time resolution of the DCD 204. For the rising and falling edge of the wished output clock one edge needs to be generated by the MMD/DCD combination. Depending on architectural choices, one, two or more chains may be used. An edge combiner 210 converts the edges provided by the one or two MMD/DCD chains into a clock with suitable duty cycle.

As the MMD 202 and the DCD 204 run on the input clock frequency, their configuration information (divider ratio, delay) needs to be provided synchronous to that clock. The desired output frequency word however can only be updated every output clock cycle and therefore is provided synchronous to the output clock. Control circuitry running on both clocks converts the requested frequency into settings of the divider and the digital delay chain. Two exemplary solutions exist, one doing most of the calculations at the high rate and one other doing the calculations on the low rate. Typically a synchronization stage is required to align both clock domains. In the most general case this is a FIFO 246, in special cases a simpler circuit maybe used taking advantage of the known phase relation between input and output clock.

Figure 3:
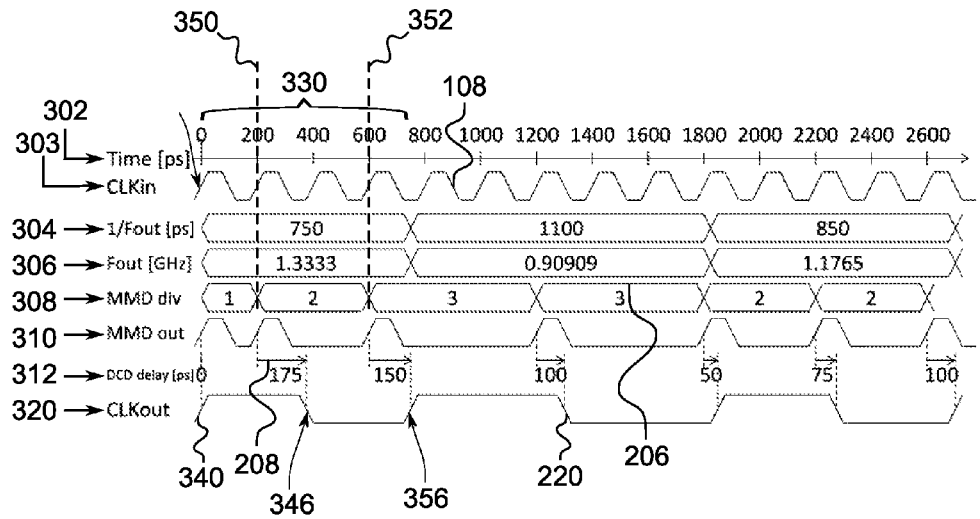
FIG. 3 shows a timing diagram illustrating the operation of an example of a circuit.

While FIG. 2 illustrates the components of a circuit 200 by means of a block diagram, FIG. 3 illustrates an example for the signals occurring within a circuit. The first row 303 illustrates the clock signal 108 oscillating with a predetermined clock frequency is illustrated in the second row. By the particular example, it is assumed that the clock signal has a frequency of 5 GHz so that a cycle time of a full cycle of the clock signal corresponds to 200 picoseconds (ps), as illustrated in the first row 302 of the illustration of FIG. 3. The third row 304 illustrates the desired cycle time for the synthesized signal and the fourth row 306 illustrates the corresponding output frequency in units of GHz. The fifth row 308 illustrates the integer factor to be applied by the multi-modulus divider 202 as indicated by the time indication signal 206 and hence one particular implementation of a time indication signal 206. The seventh row 312 gives the additional delay time as a delay control signal 208 in units of picoseconds which is required in order to meet the desired output frequency and used to control the DCD 204 of FIG. 2. The eight row 320 illustrates the synthesized signal 220 as provided by a circuit 200 of FIG. 2.

As elaborated on above, the delay generator or multi-modulus divider 202 of the example of FIG. 2 provides for the coarse time resolution while the delay element 204 provides for the fine time resolution. The following description focuses on the generation of a first cycle time 330 for the synthesized signal since the subsequent cycle times and their associated signal components are generated accordingly. As apparent from the third row 304, the desired cycle time of the synthesized signal within the first cycle 330 is 750 ps while the input clock oscillates with a cycle time of 200 ps. A falling edge within the synthesized signal 220 should be provided after 375 ps of the occurrence of a signal edge 340 of the synthesized signal 220 which happens to coincide with a first signal edge of the clock signal 108 while a rising or second edge shall be provided after 750 ps after the occurrence of said first signal edge 340. Assuming that the predetermined time resolution of the delay generator or multi-modulus divider 202 is one cycle time of the clock signal 108, the total delay until the occurrence of the falling edge 346 of the synthesized signal 320 is to be split into one cycle time of the clock signal 108 for the multi modulus divider 202 and additional 175 ps for the digitally-controlled delay 204, which is illustrated in the last three rows of FIG. 3. To this end, the delay generator 202 identifies the first time instant 350 after 200 ps by means of the occurrence or the output of a rising edge of a clock signal after 200 ps. This is achieved by a time indication signal 308 indicating the division of the clock signal 108 by unity. Furthermore, the delay control signal 312 is operable to control the digitally-controlled delay 204 so as to introduce a further delay by 175 ps so that a signal edge 346 is provided at a second time instant corresponding to a third signal edge of the synthesized signal. The digitally-controllable delay 204 may provide a rising edge which is turned into a falling edge by means of the edge combiner 210 or the digitally-controllable delay 204 may provide a falling edge to be used as the synthesized signal directly.

The next signal edge for the generation of the synthesized signal 220 is to be provided after another 375 ps or after 750 ps after the occurrence of the signal edge 340 of the clock signal 108. With a given time resolution of the delay generator, the next time instant identified by the delay generator occurs two clock cycles after the indication of the time instant corresponding to the falling edge 346 of the synthesized signal. To this end, the delay generator identifies a further time instant 352 two clock cycles of the clock signal 108 after the time instant 350. In order to be able to provide the rising edge of the present cycle 330 of the synthesized signal 220 at 750 ps, the delay element provides a signal edge 356, 150 ps after the time instant 352 indicated by the delay generator or multi-modulus divider 202.

In other words, FIG. 3 illustrates the timing based on the assumption that the input clock of the clock signal 108 runs at 5 GHz with a 200 ps clock period (first and second trace). The output clock would be modulated to implement the period 750 ps, 1100 ps and 850 ps (third and fourth trace). Therefore the circuit has to generate rising clock edges at times 750 ps, 750 ps+1100 ps=1850 ps and 850 ps+1100 ps+850 ps=2700 ps. Similarly, falling clock edges have to be generated at times 375 ps, 1300 ps, 2275 ps (last trace). From these times, one can find the closest input clock edges ($6^{th}$ trace) and by their distance the sequence of MMD divider values ($5^{th}$ trace). From the closest input clock edges generated by the MMD, the DCD adds the required shift to the requested output edge locations. The timing diagram assumes, that a single chain of delay generator (MMD) and delay element (DCD) is used for generating both rising and falling output clock edges.

Figure 4:
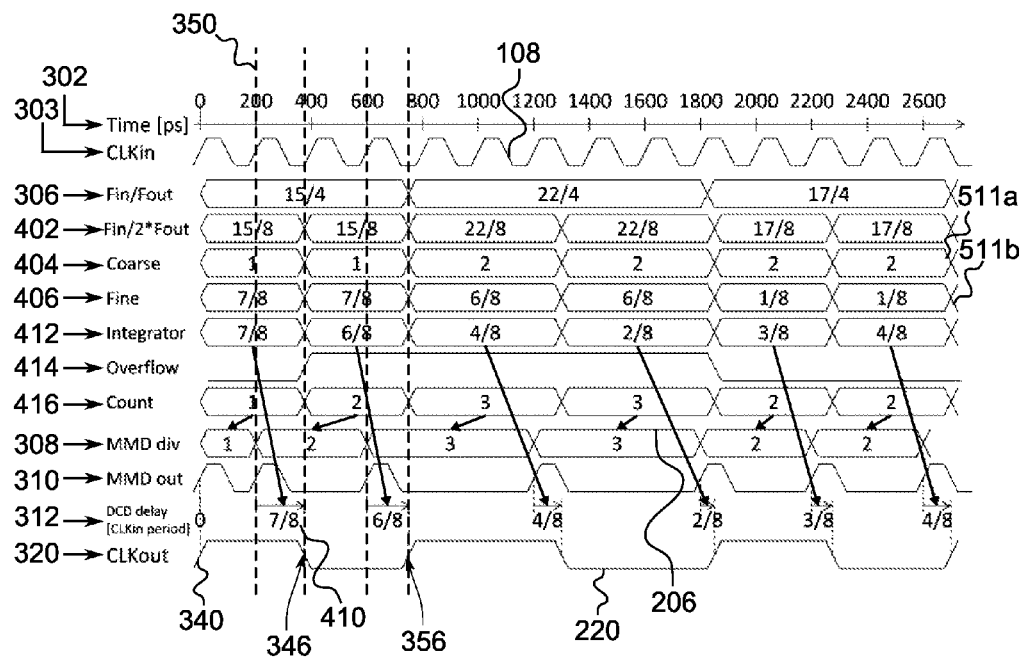
FIG. 4 illustrates a timing diagram corresponding to the example illustrated in FIG. 2.

While the illustrations of FIGS. 2 and 3 assume that appropriate control signals, i.e. a time indication signal and a delay control signal are present or derived previously, the illustrations of FIGS. 4 and 5 illustrate in more detail as to how such control signals to control the circuit may be derived. In this respect, FIGS. 4 and 5 are subsequently described together as an example of a controller for controlling a circuit for generating a synthesized signal. The output frequency and the output period for the synthesized signal is identical to the illustration of FIG. 3. However, in digitally-implemented examples, the calculations and quantities for the time indication signal and the delay-controlled signal may be required or calculated in units or terms of clock signals or frequencies of the clock signal 108. Therefore, the third row 306 indicating the sequence of requested output frequencies or output period times in FIG. 4 is normalized to the frequency of the clock signal 108 with the predetermined frequency and also the delay times for the delay element are normalized to an input clock period of the clock signal 108. Since the period is the inverse of the frequency, the ratio between the output periods and the cycle times of the clock signal 108 can also be given as the ratio between the frequency of the clock signal 108 and the desired instantaneous output frequency of the synthesizer signal. In other words, the desired output frequency may also be given in units of the frequency of the clock signal 108.

The first full cycle 330 of the synthesized signal corresponds to 15/4 times the cycle time of the clock signal 108. Under the assumption that each of the rising and falling edges of the synthesized signal should be provided by a single chain of a delay generator 202 and a delay element 204, a signal edge 346 of the synthesized signal should be provided at half the cycle time, i.e. at 15/8 times the cycle time of the clock signal 108, as illustrated in line 402. FIG. 5 illustrates a possible implementation of a controller 500 for generating some of the signals illustrated in FIG. 4. The controller receives the ratio given in line 402 as a input signal 510. The fraction 15/8 for the first half period or half cycle time of the synthesized signal is larger than 1 and may be split into its integer part 511a indicating the fraction of the total delay for the coarse time resolution of the delay generator 102 and a fractional remainder 511b of 7/8 cycle times. The fractional remainder illustrated in row 406 of FIG. 4 contributes to the delay control signal and to the delay time to be introduced by the delay element 104, which is the digitally-controlled delay 204 in this particular example. As illustrated already in FIG. 4, the signal edge 346 as provided by the delay element is generated by an identification of the first time instant 350 by means of the delay generator and the incorporation of an additional delay 410 of 7/8 cycle times by means of the delay element 104. The signal edge 346 provided by the delay element 104 corresponds to a falling signal edge of the synthesized signal.

In other words, the delay generator 102 is configured to identify the first time instant 350 such that it corresponds to an integer number of edges of the clock signal 108 after the first signal edge 340 of the clock signal. The integer number is determined using an integer result as well as an accumulated remainder of a Euclidean division of a frequency value corresponding to the time resolution of the delay generator by a signal frequency corresponding to the selectable frequency. According to some examples, the signal frequency is the selectable frequency. According to further embodiments, the signal frequency is twice the selectable frequency so that rising and falling edges of the synthesized signal may be determined by means of the delay generator. The accumulated remainder given in row 412 is determined by integrating the remainder of the Euclidean division given in row 406. For the first half period in FIG. 4, the integer result of the Euclidean division is unity. Furthermore, the fractional remainder or the remainder of the Euclidean division is 7/8. The accumulated remainder is given in the $7^{th}$ row 412 of the timing diagram of FIG. 4. The accumulated remainder is determined by integrating the remainder of the Euclidean division for all half periods or signal edges to be determined for the synthesized signal. For the first half period, the delay generator or multi-modulus divider 202 selects the first rising edge of the clock signal 108 after the occurrence of the signal edge 340 of the clock signal 108. The additional delay introduced by the delay element 104 corresponds to the accumulated remainder and, hence, to 7/8 times the cycle time of the clock signal 108.

For the second half period, the Euclidean division provides the same results as for the first half period. However, the accumulated remainder would exceed unity and potentially amount to 14/8. That is, the delay element 104 would be required to introduce a delay which is greater than the predetermined time resolution of the delay generator 102. In order to avoid increasing delay times for the delay element, the maximum delay variation of the delay element 104 may be restricted to, for example, the predetermined time resolution of the delay generator. In order to achieve this, the integrated remainder may be reduced by unity once it exceeds unity so that the corresponding delay is incorporated by means of the delay generator instead of by means of the delay element. In the particular example of FIG. 4, the accumulated remainder in row 412 is decreased by unity so that its value corresponds to 6/8 while the additional full cycle time corresponding to the predetermined time resolution of the delay generator is additionally incorporated into the delay of the delay generator. In the particular example, an overflow factor as illustrated in row 414 may be provided at every half period or cycle time of the synthesized signal when the accumulated remainder 412 would otherwise exceed unity. At the same time, the integer result of the Euclidean division is increased by unity in order to provide a time indication signal 206 indicating the numbers of cycles of the clock signal 108 to occur before a further delay of 6/8 clock periods is appended to the first time instant indicated by the delay generator. In doing so, a rising signal edge 356 of the synthesized signal is provided at an appropriate time instant.

When the computations described above are repeated for the next cycle time of the synthesized signal and all subsequent cycle times, a synthesized signal can be provided based on the clock signal 108 which may have a wide dynamic range, a high time resolution while its generation may consume little semiconductor area and power.

In other words, FIG. 4 illustrates that the sequence of requested output period times is normalized to the input clock period ($3^{rd}$ trace 306) and the DCD delay is normalized to an input clock period ($12^{th}$ trace 312). As a single MMD-DCD chain is used for generating both rising and falling output clock edges in FIG. 2, the ratio is halved to count the difference from rising to falling and falling to rising instead of rising-rising or falling-falling edges. ($4^{th}$ trace 402). This ratio between output half period and input clock period is larger than 1 and can be split into its integer part ($5^{th}$ trace, coarse delay 404) and the fractional remainder ($6^{th}$ trace, fine delay 406). The integer portion of this division ratio is related to the MMD value, i.e. to the integer value giving the division ratio for the MMD. However, the fractional part may add up and from time to time may require increasing the divider ratio by 1. To account for this, the fractional remainder of the ratio is summed up in an integrator ($7^{th}$ trace 412), which is wrapping around at 1. I.e. it starts at 0, adds the first fractional value of 7/8. When adding the next 7/8 the result will be 14/8, which is an overflow. Wraparound at 1 yields an integrator state of 6/8 and the overflow. When adding 1 in case of the integrator overflow ($8^{th}$ trace 414) to the coarse ratio, one gets the divider value for the MMD ($9^{th}$ trace 416). The integrator value matches the input of the DCD. Both the coarse ratio and integrator value need to be synchronized from the output clock domain ($9^{th}$ & $7^{th}$ trace 416, 412) into the input clock domain ($10^{th}$ & $12^{th}$ trace) when the computations of the integer result and the accumulated remainder are updated at a rate corresponding to the selectable frequency.

FIG. 5 illustrates an example of a controller 500 for controlling a circuit 200 for generating a synthesized signal oscillating with a selectable frequency according to FIG. 2. The controller 500 comprises a time indication signal calculator 502 operable to provide a time indication signal 416 indicative of a time instant being delayed with respect to a signal edge of a clock signal of the circuit 200 and a delay signal generator 504 operable to provide a delay control signal 412, the delay control signal being indicative of a delay time. A ratio 510 (R) between the desired period of the synthesized signal and the period of the clock signal 108 (or between the predetermined clock frequency and the desired instantaneous frequency of the synthesized signal) is given as a binary number, which has $m_i$ bits describing the integer part of the ratio and $m_f$ bits describing the fractional part. As illustrated in the timing diagram of FIG. 4, the fractional part of the ratio needs to be accumulated with wraparound at 1. The accumulated remainder is added to the current fractional part by means of adder 512. The accumulator has a bitwidth of $m_f$ bits, therefore the adder will have $m_{f+1}$ output bits. If the Most Significant Bit (MSB) or carry bit of this addition is 1, an overflow has occurred. The $m_f$ Least Significant Bits (LSBs) of the adder output contain the wrapped value. The carry bit is added to the integer part by means of adder 514 to obtain the divider ratio for the MMD. The delay for the DCD may be quantized with fewer bits $m_D$ than $m_f$. Then only the $m_D$ MSB of the accumulator value are used to control the delay. By this the accumulator also acts as first order noise shaper for the time quantization error of the DCD. Depending on the requirements additional noise shaping stages may be introduced at this point. In the given example of FIG. 5, the circuit would run at twice the output clock frequency, i.e. on both edges of the output clock so as to correspond to the timing diagram of FIG. 4.

In summary, one particular example as to how the computation of a time indication signal for the delay generator and of a delay control signal for the delay element may be performed at the output rate or at the rate of a selectable frequency is illustrated in FIG. 5. The delay control signal 412 is used to control the fine delay and the time indication signal 416 is used to control the coarse delay. In the particular example of FIG. 2, this corresponds to using the time indication signal 416 to control the multi-modulus divider 202, while the digitally controllable delay 204 is controlled by means of the delay control signal 412.

Alternative examples, however, use the delay generator to provide a delayed representation of the clock signal and hence to incorporate the fine delay. In those examples, the delay control signal 412 will consequently control the delay generator while the time indication signal 412 would be used to control the delay element.

Figure 6:
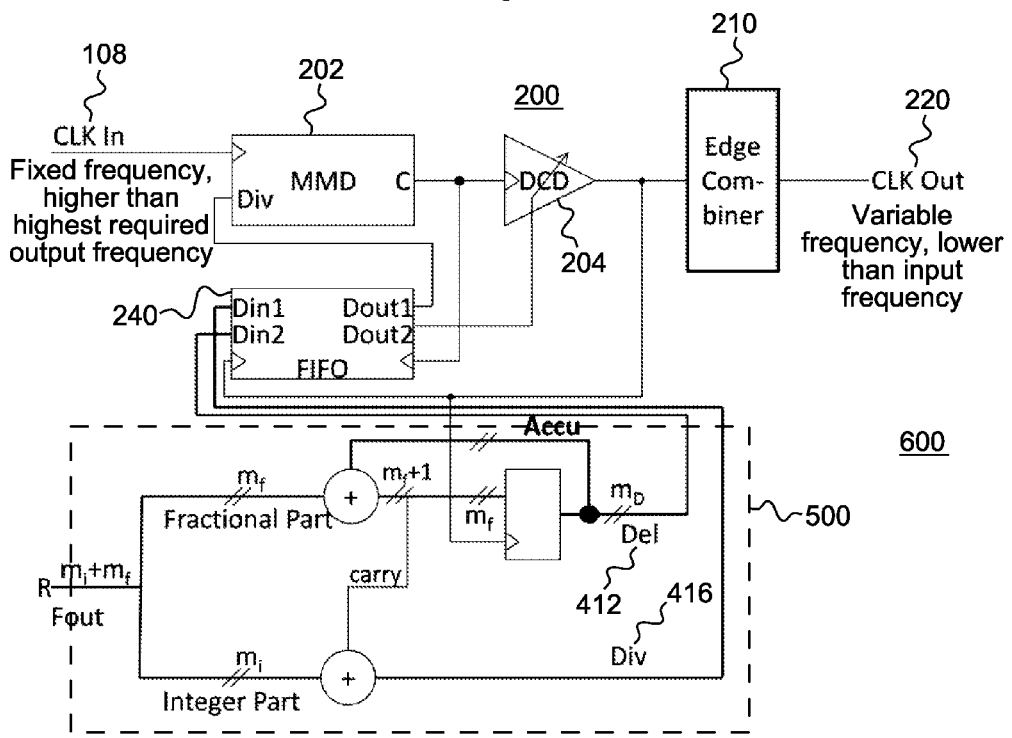
FIG. 6 shows an example of a synthesizer.

FIG. 6 illustrates an example of a synthesizer 600 using a circuit according to FIG. 2 and a controller 500 according to FIG. 5. The low rate controller 500 as described in FIG. 5 is running or updated at the rate of the DCD output. That is, it is providing a signal with twice the frequency of the output. There is a rising clock edge for each edge of the output signal. The calculated MMD and DCD control values, the time indication signal 416 and the delay control signal 412 are clocked into a FIFO or rate converter 240. This FIFO is read out by the MMD output clock, which is synchronous to the high speed input clock of the clock signal 108. The timing difference between the FIFO input and output clock therefore is limited to the 1 high speed clock cycle delay variation of the DCD plus additional analog delay variations. This FIFO implements the transition between the output and the input clock domain. At startup of the system, the FIFO may be preloaded with one value to generate a first output clock edge, which triggers the low rate calculation logic, fills the FIFO and gets the system started.

FIG. 7 illustrates an example of an application of a synthesizer 600 according to an example as described herein as a digital-to-time converter 600 within a polar transmitter. A polar transmitter is, for example, used in mobile telecommunication devices.

In mobile telecommunication devices using different modulation schemes, the content or information to be transmitted is typically provided by means of a sequence of I-samples and Q-samples, depending on the presently used modulation scheme and the content to be transmitted. A transformer 702 may be used to transform the I/Q-samples into the corresponding radius values R and azimuth angles φ of the polar representation. The transformer 702 may, for example, implement the CORDIC algorithm (coordinate rotation digital computer). While the radius component 704 may be used without further modification for a radio frequency amplifier, the angle φ 706 may be processed further so as to derive the instantaneous frequency of the baseband signal, which is related to the present cycle time of the signal to be synthesized in that the instantaneous frequency of the synthesized signal is essentially the instantaneous frequency of the baseband signal plus the center frequency of the chosen carrier. This may, for example, be achieved by differentiating the angle φ 706 so as to derive the instantaneous frequency 707 of the baseband signal. Two sample rate converters 708 may be used to convert the samples of the radius value 704 and the associated instantaneous frequency 707 to the modulated radio frequency (RF). At the output of the sample rate converter 708, a new radius sample and a new frequency sample is available for each signal edge of the signal as generated by the synthesizer 600 (the DTC output clock). While the output of the rate converter 708 is still an equivalent in terms of the baseband frequency and since the polar transmitters directly synthesize the radio frequency signal, the channel center frequency 710 of the presently-used channel is added to the frequency signal $f_{BB}$ as output by the rate converter 708. The result is the instantaneous radio frequency 711. According to the particular implementation, a divider 720 may serve to provide the ratio between the predetermined clock frequency of the clock signal 108 and the instantaneous frequency 711 to be synthesized by the synthesizer 600. The determined ratio may, for example, serve as an input 510 to the controller 500 of FIG. 5 so that the synthesizer 600 may provide a synthesized signal oscillating with the required instantaneous RF frequency 711. The provided synthesized signal 220 is then amplified with an amplification factor depending on the radius value 704 so that a directly-synthesized radio frequency signal 750 can be provided at an output of the amplifier stage 760 illustrated in FIG. 7.

Figure 8:
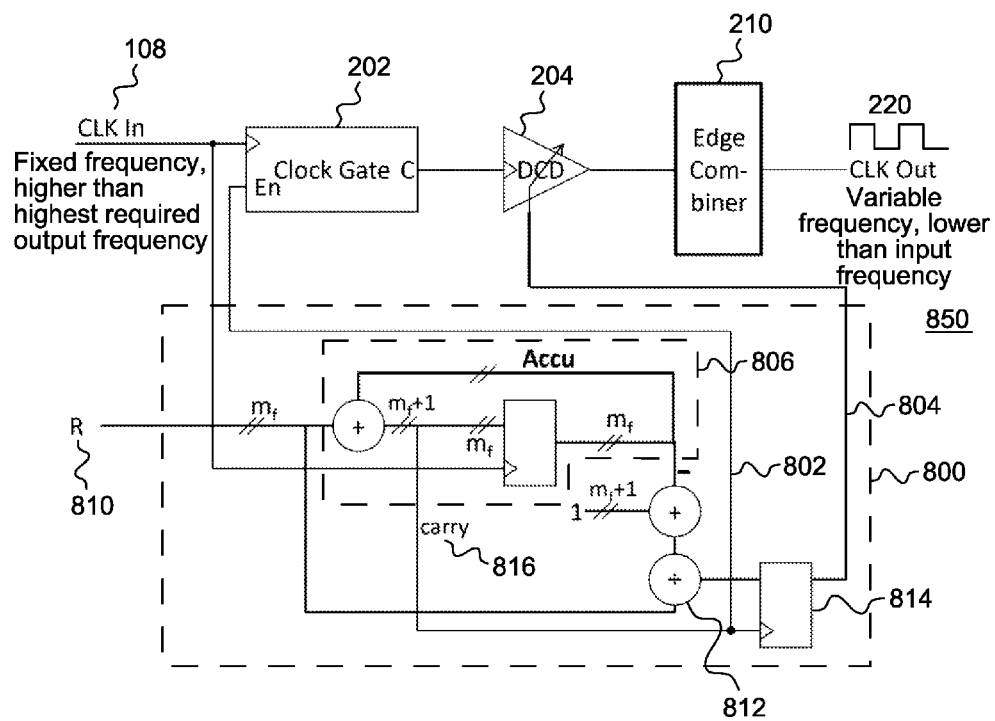
FIG. 8 shows a further example of a synthesizer.
Figure 9:
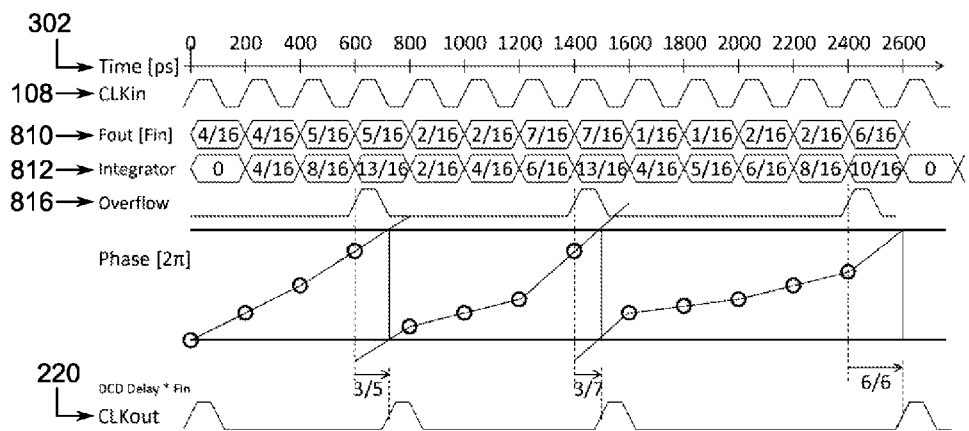
FIG. 9 shows the timing diagram of the example of a synthesizer of FIG. 8.

FIGS. 8 and 9 illustrate an alternative way to incorporate an example of a controller 800 for controlling a synthesizer according to, for example, FIG. 2 within a synthesizer 850. Since the basic principles of the controller as well as of the circuit have been described in the previous paragraphs, FIGS. 8 and 9 are only described shortly, mainly with respect to the previously disclosed implementations.

The controller 800 according to the example of FIG. 8 operates at the input clock frequency, i.e. at the predetermined frequency of the clock signal 108. A time indication signal 802 and a delay control signal 804 are updated at a rate corresponding to the predetermined clock frequency. Input to the controller 800 is the inverse of the ratio R as defined with respect to FIG. 5. Using a controller according to FIG. 8 in an example of an amplifier stage 760 may hence allow to save the divider 720. The ratio $m_F$ is accumulated within an accumulator 806 at each signal edge of the clock signal 108. In principle, one would have to provide an overflow when the accumulated value exceeds unity within the next cycle time of the clock signal 108. FIG. 9 illustrates the timing diagram in a representation corresponding to the representation of FIGS. 3 and 4. The first row indicates the time base 302, the second row the clock signal 108, the third row 810 illustrates the ratio of the predetermined clock frequency and the desired selectable frequency for each of the subsequent clock cycles of the clock signal 108. The fourth row 812 of FIG. 9 illustrates the accumulated fraction as provided by the accumulator 806. In principle, an overflow of the accumulated fraction 812 will occur from the present to the next cycle time or period of the clock signal 108.

Since the integrator 806 determines the integrated fraction 812 at time instants given by the rising edges of the clock signal 108, the delay time, i.e. the time when a hypothetical continuous integrator signal crosses unity between two subsequent clock edges is computed by means of the controller 800. This corresponds to the time when a continuous phase function crosses $2\pi$. However, the values of the integrator 804 are known before and after the overflow. That is, the time instant of the overflow can be calculated by linear interpolation. In particular, the corresponding delay signal corresponds to $(1-ACCU_R)/R$. The computation is performed when the present accumulated value plus the present ratio exceeds unity. In order to perform this calculation, a divider 812 receives, as a first input, the result of the computation $(1-ACCU_R)$, which is $(1-m_{f+1})$ and, as a second input, the present ratio or frequency word $m_f$. While the division may be performed for each clock cycle of the clock signal 108, the result of the computation is only forwarded to the delay element 204 when an overflow is determined. In the particular implementation of FIG. 8, this is achieved by providing the result of the division to a FIFO 814, the input or output of which is triggered by the presence of an overflow or carry bit 816 generated when the accumulated frequency word $m_{F+1}$ exceeds unity.

FIG. 8 is just one particular example as to how a further example of a controller may be implemented which updates the time indication signal 802 and the delay control signal 804 at a rate corresponding to the predetermined clock frequency of the clock signal 108. Using an example according to FIG. 8 within an amplifier stage 760 may allow to disregard divider 720 while divider 812 of lower accuracy is introduced. Lowering the accuracy of the dividers used increases efficiency.

In summarizing some of the examples descried herein, a fixed high frequency oscillator may be used together with a divider and a digitally-controlled delay to alleviate the tradeoffs of conventional approaches and to open the door to frequency synthesizers having a wide static output frequency range and which can nonetheless be modulated quickly and with a large range. The examples may be implemented purely digitally and therefore take full benefit from future technology scaling. For example, delay elements and their associated intrinsic delay decreases with advanced process nodes which may result in increasing delay accuracy achievable by digitally-controlled delay elements. Further, implementing the examples purely digitally avoids pulling effects and crosstalk when multiple parallel paths are running at different frequencies. Those effects typically may occur using analog circuitry or the like. In some implementations, a multi-modulus divider is used to create a coarsely frequency-modulated clock out of an input clock with a constant frequency which may be higher than the highest output frequency. A digitally-controlled delay line having a maximum delay variation of one input clock or period or more is used to shift the position of the coarse divider output to the precise position required to synthesize the given output frequency. An input to the circuit is, at each clock edge of the output clock of the synthesized signal, a requested output period normalized to the input clock period. A fractional remainder of the normalized period is integrated in an integrator overflowing at unity. The integrator value is driving the digitally-controlled delay line and the integer part of the normalized period is driving the multi-modulus divider. The integer part is increased by one, if the integrator experiences an overflow.

Figure 10:
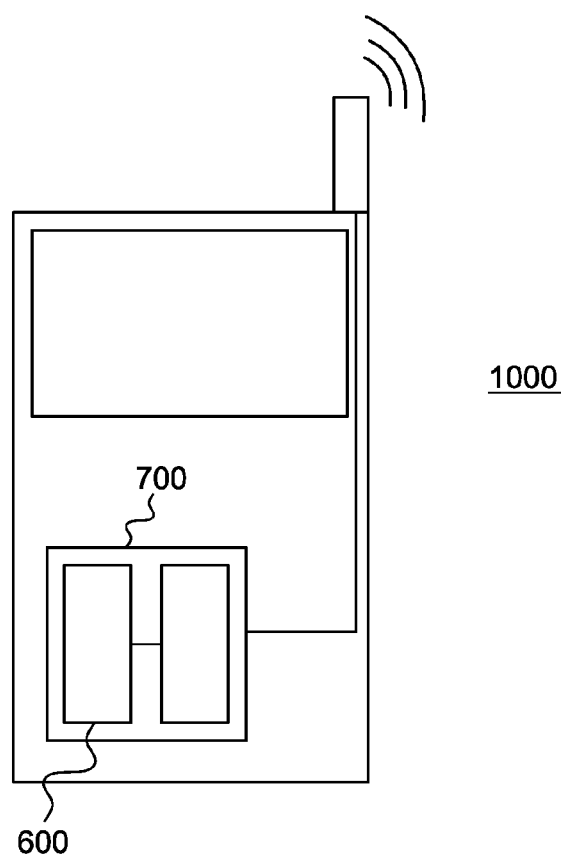
FIG. 10 illustrates schematically a mobile telecommunications device.

FIG. 10 schematically illustrates a mobile telecommunications device or a mobile phone or user equipment 1000 comprising an amplifier stage having a amplifier stage 760. The phase modulated signal within the amplifier stage 760 is provided by an example of a synthesizer 600 as described herein.

Figure 11:
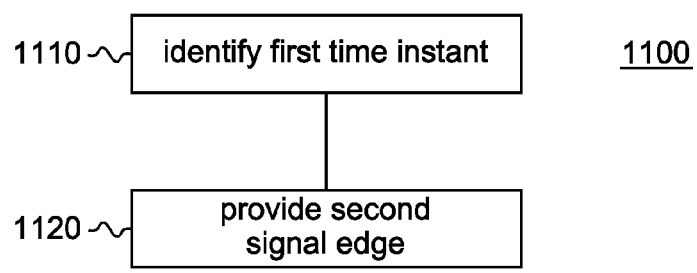
FIG. 11 illustrates a flowchart of an example of a method for generating a synthesized signal oscillating with a selectable frequency.

FIG. 11 illustrates a flowchart of an example of a method 1100 for generating a synthesized signal oscillating with a selectable frequency. The method comprises identifying (1110) a first time instant, the first time instant being delayed with respect to a first signal edge of a clock signal oscillating with a predetermined clock frequency.

The method further comprises providing (1120) a second signal edge, the second signal edge being delayed with respect to the first time instant such that the second signal edge is provided at a second time instant corresponding to a signal edge of the synthesized signal.

While the previous examples have mainly been illustrated and explained with respect to their possible use for mobile telecommunication systems as, for example, WCDMA or LTE mobile telecommunication equipment, further examples may be implemented in arbitrary other wireless transmission systems. Examples for those systems may be another one of the 3GPP-standardized mobile communication networks or mobile communication systems. The mobile or wireless communication system may correspond to, for example, a Long-Term Evolution (LTE), an LTEAdvanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc. Further examples of receiver systems or tuning circuits may also be used in connection with other wireless communication standards or protocols, such as for example Bluetooth, ZIGBEE Radar applications or the like.

The examples as described herein may be summarized as follows.

Example 1 is a circuit for generating a synthesized signal oscillating with a selectable frequency, comprises a delay generator configured to identify a first time instant, the first time instant being delayed with respect to a first signal edge of a clock signal oscillating with a predetermined clock frequency; and a delay element configured to provide a second signal edge, the second signal edge being delayed with respect to the first time instant at a second time instant corresponding to a third signal edge of the synthesized signal.

In example 2, the delay generator of example 1 is configured to select a select signal edge of the clock signal at the first time instant with a predetermined time resolution, the time resolution indicating a minimal time between a plurality of subsequent selectable edges.

In example 3, the delay element of example 1 is configured to provide the second signal edge delayed with respect to the select signal edge.

In example 4, a maximum delay variation of the delay element of example 3 corresponds to the predetermined time resolution of the delay generator.

In example 5, the predetermined time resolution of example 4 corresponds to a single cycle time of the clock signal.

In example 6, the circuit of example 1 optionally further comprises an edge combiner operable to provide the third signal edge of the synthesized signal upon the provision of the second signal edge by the delay element.

In example 7, the delay generator of examples 2 to 6 is further configured to select a further select signal edge of the clock signal at a further time instant following the first time instant.

In example 8, the delay generator of the previous examples is configured to identify the first time instant that it corresponds to an integer number of edges of the clock signal after the first signal edge, the integer number being determined using an integer result and an accumulated remainder of an Euclidian division of a frequency value corresponding to the time resolution of the delay generator by a signal frequency corresponding to the selectable frequency, the accumulated remainder being determined by integrating the remainder of the Euclidian division.

In example 9, the signal frequency of example 8 is twice the selectable frequency.

In example 10, the integer number of example 8 or 9 is determined by a sum of the integer result of the Euclidian division and an overflow factor, the overflow factor being unity if the accumulated remainder exceeds unity and zero otherwise.

In example 11, the accumulated remainder of examples 8 to 10 is decreased by unity when the integrated remainder exceeds unity.

In example 12 a delay time introduced by the delay element of example 11 is determined by multiplying the accumulated remainder and the predetermined time resolution of the delay generator.

In example 13 the delay generator of any of the preceding examples optionally further comprises a digitally controllable frequency divider.

In example 14 the delay element of any of the preceding examples optionally further comprises a digitally controllable delay.

In example 15, the delay generator of claim 1 is configured to provide a delayed clock signal, the delayed clock signal being delayed with respect to the clock signal such that a delayed signal edge of the delayed clock signal occurs at the first time instant.

In example 16, the delayed clock signal of example 15 oscillates with the predetermined clock frequency.

In example 17, the delay element of examples 15 or 16 is configured to select the second signal edge of the delayed clock signal at the time instant corresponding to the third signal edge of the synthesized signal with a predetermined time resolution, the time resolution indicating a minimal time between 2 subsequent selectable edges.

In example 18, a maximum delay variation of the delay generator of example 17 corresponds to the predetermined time resolution of the delay element.

In example 19, the circuit of any of the preceding examples optionally further comprises a further delay generator configured to identify a third time instant, the third time instant being delayed with respect to the first signal edge of the clock signal oscillating with a predetermined clock frequency; and a further delay element configured to provide a further signal edge, the further signal edge being delayed with respect to the third time instant at a fourth time instant corresponding to a further signal edge of the synthesized signal.

In example 20, the third signal edge of the synthesized signal of example 19 is a rising edge and the further signal edge of the synthesized signal is a falling edge.

Example 21 is a controller for controlling a circuit for generating a synthesized signal oscillating with a selectable frequency, the controller comprising: a time identification signal calculator operable to provide a time indication signal indicative of a time instant being delayed with respect to a first signal edge of a clock signal of the circuit; and a delay signal generator operable to provide a delay control signal, the delay control signal being indicative of a delay time.

In example 22, the time identification signal calculator of example 21 is operable to determine an integer number using an integer result and an accumulated remainder of an Euclidian division of a frequency value corresponding to a time resolution of the circuit by a signal frequency corresponding to the selectable frequency, the accumulated remainder being determined by integrating the remainder of the Euclidian division.

In example 23, the delay signal generator of example 22 is operable to determine the delay control signal using a fractional component of the accumulated remainder.

In example 24, the accumulated remainder of example 23 is decreased by unity when the integrated remainder exceeds unity.

In example 25 the delay time of examples 23 and 24 is determined by multiplying the integrated remainder and the time resolution.

In example 26, the controller of examples 21 to 25 optionally further comprises an integrator circuit operable to integrate the remainder of the Euclidian division.

In example 27, the time indication signal and the delay control signal of examples 21 to 26 are updated at a rate corresponding to the predetermined clock frequency.

In example 28, the time indication signal and the delay control signal of examples 21 to 26 are updated at a rate corresponding to the selectable frequency.

In example 29, the controller of examples 21 to 28 optionally further comprises an overflow factor generator operable to determine an overflow factor, the overflow factor being unity if the accumulated remainder exceeds unity and being zero else and to decrease the accumulated remainder by the overflow factor.

In example 30, the controller of example 29, further optionally comprises an overflow factor transferer operable to add the overflow factor to the integer number if the overflow factor is unity.

Example 31 is a synthesizer for generating a synthesized signal oscillating with an adjustable frequency, comprising a circuit according to any of examples 1 to 20; and a controller according to any of examples 22 to 31 coupled to the circuit, the controller being operable to control the circuit.

In example 32, the time indication signal and the delay control signal of the controller of example 31 are used to control the delay generated by the delay generator and the delay generated by the delay element.

Example 33 is an amplifier stage, comprising an amplifier comprising an input for a phase modulated signal; and a phase modulator operable to provide the phase modulated signal, the phase modulator comprising a synthesizer according to any of examples 31 or 32.

In example 34, the amplifier stage of claim 33 optionally further comprises a frequency to time converter operable to transform a present frequency of the phase modulated signal to a corresponding present cycle time used as an input to the synthesizer.

Example 35 is a mobile telecommunications device comprising an amplifier stage of examples 33 or 34.

Example 36 is means for generating a synthesized signal oscillating with a selectable frequency, comprising: means for identifying a first time instant, the first time instant being delayed with respect to a first signal edge of a clock signal oscillating with a predetermined clock frequency; and means for providing a second signal edge, the second signal edge being delayed with respect to the first time instant such that the second signal edge is provided at a second time instant corresponding to a third signal edge of the synthesized signal.

In example 37, the means for identifying a first time instant of example 36 is configured to select a select signal edge of the clock signal at the first time instant with a predetermined time resolution, the time resolution indicating a minimal time between 2 subsequent selectable edges.

Example 38 is means for controlling a circuit for generating a synthesized signal oscillating with a selectable frequency using a clock signal oscillating with a predetermined clock frequency, comprising means for providing a time indication signal indicative of a time instant being delayed with respect to a first signal edge of a clock signal; and means for providing a delay control signal, the delay control signal being indicative of a delay time.

Example 39 is a method for generating a synthesized signal oscillating with a selectable frequency, comprising: identifying a first time instant, the first time instant being delayed with respect to a first signal edge of a clock signal oscillating with a predetermined clock frequency; and providing a second signal edge, the second signal edge being delayed with respect to the first time instant such that the second signal edge is provided at a second time instant corresponding to a third signal edge of the synthesized signal.

In example 40, identifying a first time instant of example 39 comprises selecting a select signal edge of the clock signal at the first time instant.

Example 41 is method for controlling a circuit for generating a synthesized signal oscillating with a selectable frequency, comprising providing a time indication signal indicative of an integer number of clock cycles of the clock signal; and providing a delay control signal, the delay control signal being indicative of a delay time.

In example 42, providing the time indication signal of example 41 comprises determining an integer result and an accumulated remainder of an Euclidian division of a frequency value corresponding to a time resolution of the circuit by a signal frequency corresponding to the selectable frequency, the accumulated remainder being determined by integrating the remainder of the Euclidian division.

Example 43 is a computer program having a program code configured to perform a method according to any of examples 39 to 41, when the program code is executed on or by a processor.

Example 44 is a computer readable storage medium having stored thereon a program a program code configured to perform an example according to any of claims 39 to 41, when the program code is executed on or by a processor.

Examples may further provide a computer program having a program code for performing one of the above methods, when the computer program is executed on a computer or processor. A person of skill in the art would readily recognize that steps of various above-described methods may be performed by programmed computers. Herein, some example examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . ." (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A circuit for generating a synthesized signal oscillating with a selectable frequency, comprising:
   a delay generator configured to identify a first time instant, the first time instant being delayed with respect to a first signal edge of a clock signal oscillating with a predetermined clock frequency; and
   a delay element configured to provide a second signal edge, the second signal edge being delayed with respect to the first time instant at a second time instant corresponding to a third signal edge of the synthesized signal.

2. The circuit of claim 1, wherein the delay generator is configured to select a select signal edge of the clock signal at the first time instant with a predetermined time resolution, the time resolution indicating a minimal time between a plurality of subsequent selectable edges.

3. The circuit of claim 2, wherein the delay element is configured to provide the second signal edge delayed with respect to the select signal edge.

4. The circuit of any of claim 2, wherein a maximum delay variation of the delay element corresponds to the predetermined time resolution of the delay generator.

5. The circuit of claim 4, wherein the predetermined time resolution corresponds to a single cycle time of the clock signal.

6. The circuit of claim 1, further comprising:
   an edge combiner operable to provide the third signal edge of the synthesized signal upon the provision of the second signal edge by the delay element.

7. The circuit of claim 2, wherein the delay generator is further configured to select a further select signal edge of the clock signal at a further time instant following the first time instant.

8. The circuit of claim 1, wherein the delay generator is configured to identify the first time instant that corresponds to an integer number of edges of the clock signal after the first signal edge, the integer number being determined using an integer result and an accumulated remainder of an Euclidian division of a frequency value corresponding to the time resolution of the delay generator by a signal frequency corresponding to the selectable frequency, the accumulated remainder being determined by integrating the remainder of the Euclidian division.

9. The circuit of claim 8, wherein the signal frequency is twice the selectable frequency.

10. The circuit of claim 8, wherein the integer number is determined by a sum of the integer result of the Euclidian division and an overflow factor, the overflow factor being unity if the accumulated remainder exceeds unity and zero otherwise.

11. The circuit of claim 8, wherein the accumulated remainder is decreased by unity when the integrated remainder exceeds unity.

12. The circuit of claim 11, wherein a delay time introduced by the delay element is determined by multiplying the accumulated remainder and the predetermined time resolution of the delay generator.

13. The circuit of claim 1, wherein the delay generator comprises a digitally controllable frequency divider.

14. The circuit of claim 1, wherein the delay element comprises a digitally controllable delay.

15. The circuit of claim 1, wherein the delay generator is configured to provide a delayed clock signal, the delayed clock signal being delayed with respect to the clock signal such that a delayed signal edge of the delayed clock signal occurs at the first time instant.

16. The circuit of claim 15, wherein the delayed clock signal oscillates with the predetermined clock frequency.

17. The circuit of claim 15, wherein the delay element is configured to select the second signal edge of the delayed clock signal at the time instant corresponding to the third signal edge of the synthesized signal with a predetermined time resolution, the time resolution indicating a minimal time between 2 subsequent selectable edges.

18. The circuit of claim 17, wherein a maximum delay variation of the delay generator corresponds to the predetermined time resolution of the delay element.

19. A controller for controlling a circuit for generating a synthesized signal oscillating with a selectable frequency, the controller comprising:
  a time identification signal calculator operable to provide a time indication signal indicative of a time instant being delayed with respect to a first signal edge of a clock signal of the circuit; and
  a delay signal generator operable to provide a delay control signal, the delay control signal being indicative of a delay time.

20. Method for generating a synthesized signal oscillating with a selectable frequency, comprising:
  identifying a first time instant, the first time instant being delayed with respect to a first signal edge of a clock signal oscillating with a predetermined clock frequency; and
  providing a second signal edge, the second signal edge being delayed with respect to the first time instant such that the second signal edge is provided at a second time instant corresponding to a third signal edge of the synthesized signal.

21. Method for generating a synthesized signal according to claim 20, wherein identifying a first time instant comprises selecting a select signal edge of the clock signal at the first time instant,
  providing a delay control signal, the delay control signal being indicative of a delay time.

* * * * *